United States Patent [19]

Clark

[11] 4,100,563
[45] Jul. 11, 1978

[54] SEMICONDUCTOR MAGNETIC TRANSDUCERS

[75] Inventor: Lowell E. Clark, Scottsdale, Ariz.

[73] Assignee: Motorola, Inc., Schaumburg, Ill.

[21] Appl. No.: 851,225

[22] Filed: Nov. 14, 1977

Related U.S. Application Data

[63] Continuation of Ser. No. 726,891, Sep. 27, 1976, which is a continuation of Ser. No. 537,145, Dec. 30, 1974, abandoned.

[51] Int. Cl.² .................. H01L 27/22; H01L 29/82; H01L 29/96
[52] U.S. Cl. .................................... 357/27; 357/25; 357/34; 357/20; 357/35; 357/51
[58] Field of Search ................ 357/25, 26, 27, 34, 357/35, 36, 20, 51

[56] References Cited

U.S. PATENT DOCUMENTS

| Re. 28,928 | 8/1976 | Hart | 357/35 |
|---|---|---|---|
| 3,533,159 | 10/1970 | Hudson | 357/26 |
| 3,684,933 | 8/1972 | Schultz et al. | 357/35 |
| 3,760,239 | 9/1973 | Fletcher et al. | 357/35 |
| 3,880,675 | 4/1975 | Tarui et al. | 357/35 |
| 3,890,634 | 6/1975 | Ruegg | 357/35 |
| 3,893,017 | 7/1975 | Williams | 357/35 |
| 3,970,866 | 7/1976 | Fulkerson | 357/51 |
| 3,971,060 | 7/1976 | Leuschner | 357/51 |
| 3,987,477 | 10/1976 | Krolik | 357/35 |

Primary Examiner—Andrew J. James
Attorney, Agent, or Firm—Lowell E. Clark

[57] ABSTRACT

Magnetically sensitive semiconductor elements suitable for fabrication in monolithic integrated circuits are disclosed. The elements comprise a semiconductor region of one conductivity type with contact means for providing current flow generally parallel to a major axis, a second orthogonal axis for the application of a magnetic field, and yet a third mutually orthogonal axis along which are disposed at least three second type conductivity regions forming in combination with the first major region a transistor structure with differential properties. In some of the embodiments, low magnetic offset is provided by a selfaligning feature, and power comsumption is minimized by a high resistance region in the device.

9 Claims, 6 Drawing Figures

SEMICONDUCTOR MAGNETIC TRANSDUCERS

This is a continuation, of application Ser. no. 726,891, filed Sept. 27, 1976; which is a continuation of Ser. No. 537,145 filed Dec. 30, 1974, both now abandoned.

BACKGROUND

This invention relates to magnetic transducers, and to magnetically sensitive semiconductor devices, and more specifically to magnetically sensitive semiconductor devices suitable for fabrication in conventional integrated circuits. Various methods have been devised for detection of magnetically deflected carriers in semiconductors, but they all have very low sensitivity, usually less than 1%/kilogauss. Hereinafter, 1%/kilogauss means one percent differential change in the output current of the transducer per kilogauss magnetic field strength applied in the direction causing maximum change in the output current of the transducer.

The closest prior art magnetic transducers have operation based on differential collection of injected minority carriers preferentially deflected by a magnetic field to one or the other of two split collectors. Such magnetic transducers have very low sensitivity. Hall elements have been used on semiconductor chips as transducers having integrated circuit sensing amplifiers on the same chip, wherein the voltage across the Hall element is differentially sensed. But such devices are relatively inefficient, have high offset and power consumption, require a considerable amount of chip area, and are difficult to manufacture. None of the prior art devices is readily adaptable to fabrication in integrated circuits. The present invention solves the shortcoming of the prior art by providing a magnetically sensitive semiconductor device suitable for use in conventional integrated circuit structures, and having sensitivity much greater than 5%/kilogauss. The output of the magnetically sensitive device of the present invention may be detected and further amplified to a desired level by an integrated amplifier on the same chip.

SUMMARY OF THE IVENTION

In view of the foregoing, an object of this invention is to provide a magnetically sensitive semiconductor element with improved sensitivity to magnetic fields which is capable of providing a differential output signal.

Another object of this invention is to provide an improved magnetically sensitive semiconductor device suitable circuit detecting and conditioning means are provided on the same chip as the magnetic device.

Another object of this invention is to provide for reduced power consumption of the magnetodevice. Prior art devices have often required several hundred milliwatts, precluding their use in many applications.

Yet another object of this invention is to provide for reduced offset, that is, smaller differential output signal, in the absence of a magnetic field. Such offset is invariably present in mass produced devices because of geometrical asymmetries and semiconductor material inhomogeneities.

A feature of this invention is provision of a semiconductor magnetic transducer including a first major region of one conductivity type, and integral multiple opposite conductivitytype regions disposed in junction-forming relation with the first region to detect a Hall voltage induced in the first region under suitable excitation.

Another feature of this invention is the use of high-resistivity in the first major region to limit the magnetic bias current, thus preventing excessive power dissipation. Another feature of this invention is the self-alignment of the second type semiconductor regions to the magnetic bias resistor. This helps in the reduction of the zero magnetic field offset which is a problem in many semiconductor magnetic transducers.

Yet another feature of this invention is the provision of junction regions with lateral assymmetries in order to enhance the magnetic sensitivity of the device.

DETAILED DESCRIPTION OF THE INVENTION

Figure 1:
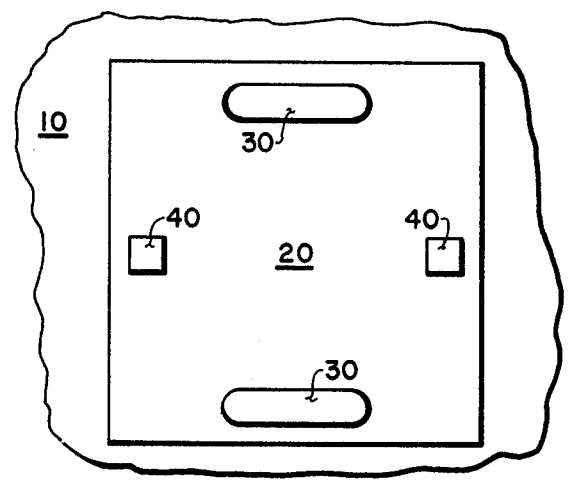
FIG. 1 is a top view of representative prior art semiconductor magnetic transducers.

FIG. 1 is a top view of a typical Hall effect device in integrated embodiment. High resistivity region 20 of one conductivity type is surrounded on the sides and bottom (not down) by second conductivity type isolating region 10. Regions 30 are ohmic contacts for the application of current to the high resistivity region 20, while regions 40 are for the purpose of sensing the voltage developed when a magnetic field is applied perpendicular to the plane of the paper. Such Hall effect devices typically have an aspect ratio of about 1, and develop a Hall voltage (between terminals 40) of about 1% of the voltage applied between terminals 30. Since the region 20 must be suitable for transistor fabrication in an integrated embodiment, it typically has 1 ohm-centimeter resistivity and a thickness of 10 microns. Thus its sheet resistance is about 1000 ohms per square, and the application of 10 volts between terminals 30 can result in over 100 milliwatts of power dissipation. In addition, the device must be fairly large laterally to avoid offset problems due to geometrical tolerances. Thus, the boundary between regions 10 and 20 must be symmetrically disposed with respect to the contacts 30 and 40, which themselves must be symmetrical (in shape and disposition) with respect to orthogonal axes through the center of the devices. Since the isolation region 10 and the contacts 30 and 40 result from two separate masking steps, cumulative misalignment results in asymmetries. Also, because of the tolerances in mask making and wafer masking, fairly large overall geometries are required to minimize the relative importance of errors in individual elements of the mask.

Figure 2:
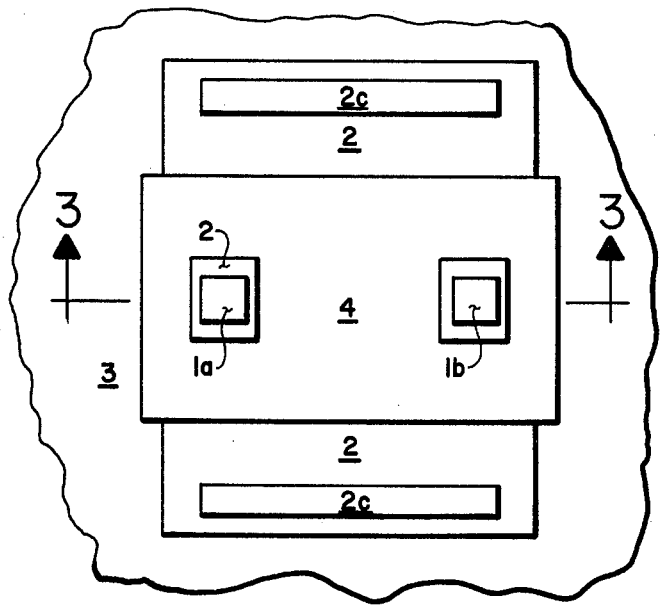
FIG. 2 is a top view of one embodiment of the invention.
Figure 3:
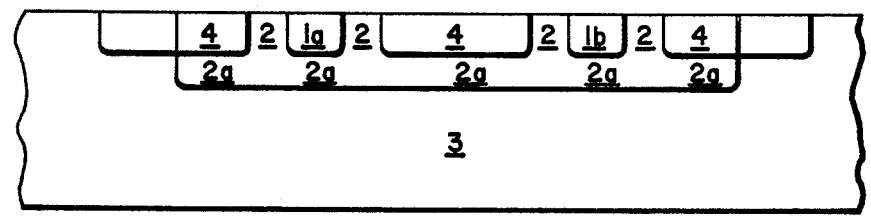
FIG. 3 is a side view of the device depicted in FIG. 2.

In FIG. 2, which depicts one embodiment of the present invention suitable for conventional integration, region 2 is of one conductivity type and surrounded by opposite type region 3. Region 2 might be obtained for example by diffusion into region 3. Regions 1a, 1b, and 4 are delineated by the same masking step and formed by the same processing step; the regions 1a and 1b are separate emitters in the same base region 2, while region 4, which is also of opposite conductivity type to base region 2, serves to eliminate the conduction that would otherwise occur near the surface of base region 2. This is more clearly shown in FIG. 3, where region 4 replaces half of region 2 in selected areas; thus the sheet resistivity of the portion 2a of region 2 may be substantially enhanced in these areas. For typical current gains of 100–200, the base sheet resistivity under an emitter region will approach ten thousand ohms per square.

Again with reference to FIG. 2, by applying a Hall bias current through regions 2 and 2a by means of the two contact regions 2c, the device operates as a magnetic transducer. Upon application of a magnetic field perpendicular to the plane of the paper, a voltage $\Delta V$ is set up across the base between the two emitter regions. If the composite transistor is biased in the active mode with a constant base current drive and with the emitters converted to a constant voltage source, then the emitter currents, which are substantially identical in the absence of the magnetic field, will have the ratio:

$$\frac{I_a}{I_b} = \frac{A_a}{A_b} \exp \pm \frac{q\Delta V}{kT}$$

where $I_a$ and $A_a$ are the emitter current and emitter area respectively for emitter region 1a, and $I_b$ and $A_b$ are the corresponding quantities for emitter region 1b. The foregoing relation is a result of the well known exponential relationship between emitter current and base emitter voltage in a bipolar transistor; $q$ is the electronic charge, $k$ is Boltzmann's constant, and $T$ is the absolute temperature. Because of the exponential nature of the foregoing relationship, very large ratios and hence very large differences between the emitter currents may be obtained with only modest values of $\Delta V$. Thus the device has high inherent sensitivity.

Since $\Delta V$ for a given applied magnetic field strength will be linearly proportional to the voltage applied between contacts 2c in FIG. 2, maximum sensitivity is achieved with maximum applied voltage $V_A$. The power associated with the Hall bias current is proportional to $V_A^2/R$, where $R$ is the resistance between the terminals 2c; clearly $R$ is desirably high. In this embodiment, $R$ is determined primarily by the sheet resistance of region 2a, since that portion of region 2a covered by region 4 desirably has a length-to-width ratio of about unity. As explained earlier, region 2a in FIG. 3 may have an order of magnitude higher sheet resistivity than region 20 in FIG. 1, the power dissipation may be significantly less for the structure of FIGS. 2 and 3 than for prior art structures.

Another advantage comes from the self-alignment of regions 4, 1a and 1b, which result from the same patterning step. Sice the sheet resistivity of region 2a may approach a value two orders of magnitude higher than region 2, the zero magnetic field offset (the difference in emitter currents $I_a$ and $I_b$) will be relatively insensitive to the positions of regions 2c, which portions are ordinarily determined by a separate alignment step from the one delineating the regions 1a, 1b and 4. The regions 2a laterally outside the emitters 1a and 1b toward region 3 in FIGS. 2 and 3 can influence the offset undesirably if they are asymmetrical. This effect can be minimized at the expense of some increase in power dissipation by enlarging the device laterally so that the lateral terminations of regions 2a along a axis determined by regions 1a and 1b are more remote from the emitter regions 1a and 1b.

From a circuit standpoint, the preferred bipolar embodiment of the present invention would be a structure with isolated collectors. That is, with reference to FIG. 3, region 3 should be split, by junction isolation or other means, along a vertical section extending through the center of the central portion of region 4. Such isolation is somewhat difficult to achieve with conventional techniques without upsetting the other features of the invention; however, such a structure is believed to be the preferred discrete embodiment.

Figure 4:
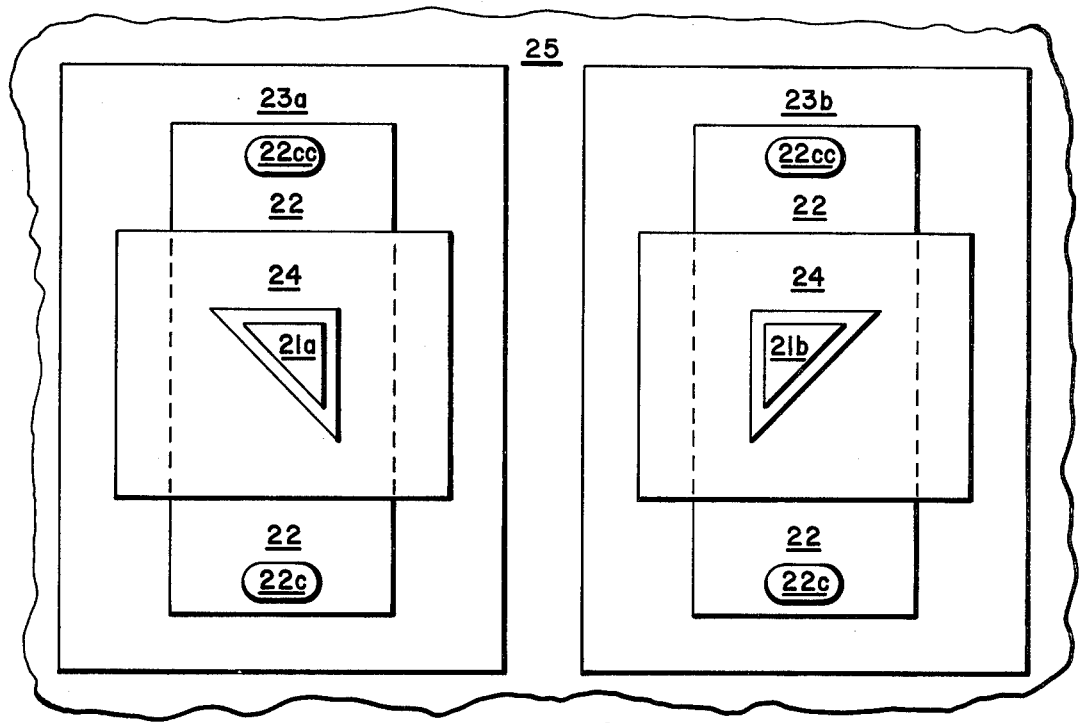
FIG. 4 is yet another embodiment of the invention.

FIG. 4 is a top view of another bipolar embodiment which achieves the split-collector feature in a manner compatible with conventional junction integration techniques. The numbered elements correspond with a difference often to those of FIGS. 2 and 3, with the additional showing of isolation region 25 which also surrounds (not shown) the bottom of regions 23a and 23b, which are collectors Regions 22 are base regions, and 21a and 21b are emitter regions with deliberate inhomogeneities along a horizontal or x-axis. In operation regions 22cc are electrically common and in combination with regions 22c, also common, serves to set up the magnetic bias current generally along y-axis. When a axis. magnetic field is applied perpendicular to the plane of the paper, the lateral (x-axis) voltage gradient serves to enhance the bipolar current density emission from the larger portion of region 21a and the smaller portion of region 21b, or vice versa. Since the collector current will be related to the current density times the area available for emission, the collector current will be enhanced or the side where the emission is pushed to the larger side of the emitter by the Hall effect. This embodiment also includes the highsensitivity and low-offset features engendered by regions 24 as previously discussed.

Figure 5:
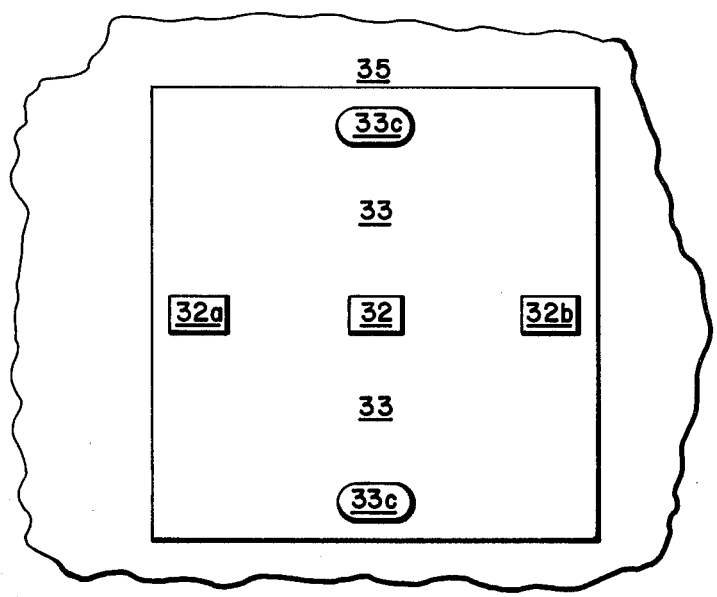
FIG. 5 is a further bipolar embodiment of the invention.

FIG. 5 is a top view of another integrable magnetotransistor in accordance with the present invention. Here high-resistivity region 33 together with contacts 33c serve to set up the magnetic bias current generally along a y-axis, while opposite conductivity type regions 32, 32a and 32b are disposed in junction forming relation along an axis mutually orthogonal to the magnetic bias and the magnetic field, which is again perpendicular to the plane of the paper.

Region 33 surrounds regions 32, 32a and 32b on the bottoms as well as the sides, and regions 32, 32a and 32b are biased with respect to region 33 so that region 32 is an emitter and regions 32a and 32b are split collectors of a lateral bipolar transistor. Application of the magnetic field serves to enhance emission from one or the other side of region 32, resulting in a differential collector current. Region 35 is an optional isolation region.

Figure 6:
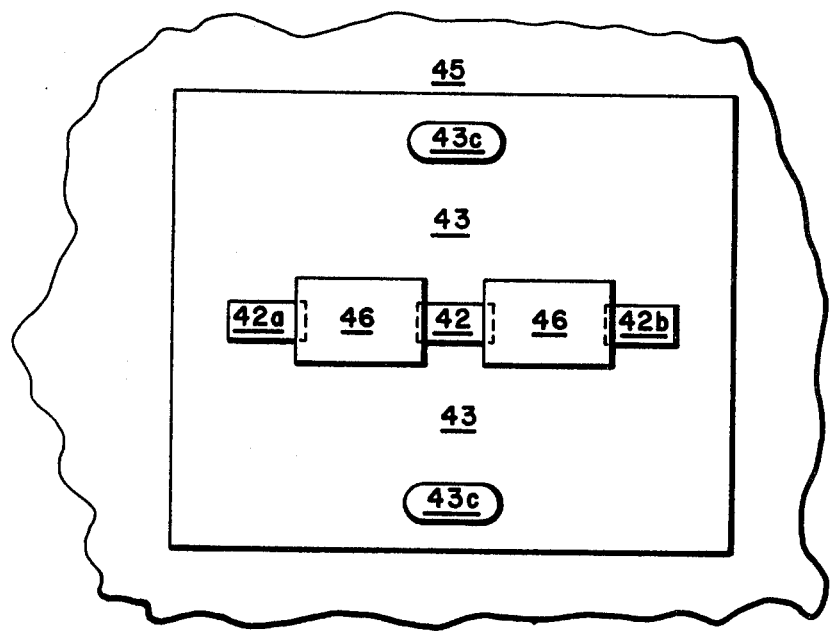
FIG. 6 is an MOS embodiment of the invention.

FIG. 6 is a top view of a MOS embodiment of the instant invention. The elements generally correspond structurally to those of FIG. 5, with the addition of a gate-over-insulator element 46, which serves to control MOS action between common source 42 and split drains 42a and 42b. It is well known that MOS transistor conduction can be sensitive to source-body-bias (region 42 to region 43); this bias is provided again by the action of the magnetic field in concert with the magnetic bias current provided between contacts 43c. Again region 45 is an optional isolation region of opposite type to region 43, and surrounding 43 on the bottom (not shown) as well as the sides. Note that by making regions 42, 42a, 42b of the same conductivity type as thin layer 43 over region 45, a JFET structure is achieved, which will be magnetically sensitive by virtue of the differential conduction in channel regions of layer 43 between source 42 and split drains 12a and 42b.

While the invention has been wide shown in connection with several specific examples, it will be readily apparent to those skilled in the art that various changes in form and arrangements of part way be made for optimization to specific requirements without departing from the spirit and scope of the present invention.

What is claimed is:

1. A semiconductor device for sensing a magnetic field, comprising:
   a first major region of a first conductivity type and having a major surface and two contact means for providing current along a path therebetween;
   second, third and fourth regions of second conductivity type in p-n junction relation with and mutually isolated by said first region at said surface, said second, third and fourth regions lying along a straight line perpendicular to a straight line connecting said contact means, one of said second, third and fourth regions lying on said straight line connecting said contact means; and
   a fifth region of said second conductivity type in p-n junction relation with and completely surrounding said first region at said surface.

2. The device of claim 1, where said fourth region individually surrounds said second and said third region at said surface.

3. The device of claim 2, where said fourth region merges with said fifth region, said fourth and fifth regions having different penetrations beneath said surface.

4. The device of claim 1, where said second region is the emitter, said first region is the base, and said third and forth regions are the collectors of a dual-collector bipolar transistor.

5. The device of claim 1, where said second region is the source and said third and fourth regions are the drains of a dual-drain field-effect transistor.

6. The device of claim 1, where said fifth region also surrounds the subsurface portion of said first region.

7. A semiconductor device for sensing a magnetic field, comprising:
   first and second major regions of a first conductivity type, each of said regions bounded by a common major surface of the device and each of said regions junction-isolated from the other and each having two contact means for providing a current along a path therebetween, said paths being parallel; and
   third and fourth regions of second conductivity type in p-n junction relation with said first and second regions respectively at said surface, said third and fourth regions lying along a line perpendicular to lines connecting said contact means.

8. The device of claim 7 further including fifth and sixth regions of said second conductivity in p-n junction relation with said first and second regions respectively at said surface, said fifth and sixth regions surrounding said third and said fourth regions respectively at said surface.

9. The device of claim 8 where the cross-sections of said third and fourth regions vary along paths between said contacts.

* * * * *